United States Patent
Hwangbo et al.

(10) Patent No.: US 10,770,426 B2
(45) Date of Patent: Sep. 8, 2020

(54) MICRO DEVICE TRANSFERRING METHOD, AND MICRO DEVICE SUBSTRATE MANUFACTURED BY MICRO DEVICE TRANSFERRING METHOD

(71) Applicant: CENTER FOR ADVANCED META-MATERIALS, Daejeon (KR)

(72) Inventors: Yun Hwangbo, Daejeon (KR); Byung Ik Choi, Daejeon (KR); Jae Hyun Kim, Daejeon (KR); Yeon Woo Jeong, Daejeon (KR); Seong Min Hong, Daejeon (KR); Bong Kyun Jang, Daejeon (KR); Kwang Seop Kim, Daejeon (KR); Kyung Sik Kim, Daejeon (KR); Hak Joo Lee, Daejeon (KR)

(73) Assignee: CENTER FOR ADVANCED META-MATERIALS, Daejeon (KR)

( * ) Notice: Subject to any disclaimer, the term of this patent is extended or adjusted under 35 U.S.C. 154(b) by 89 days.

(21) Appl. No.: 16/327,856

(22) PCT Filed: Aug. 21, 2017

(86) PCT No.: PCT/KR2017/009082
§ 371 (c)(1),
(2) Date: Mar. 26, 2019

(87) PCT Pub. No.: WO2018/038481
PCT Pub. Date: Mar. 1, 2018

(65) Prior Publication Data
US 2019/0259728 A1    Aug. 22, 2019

(30) Foreign Application Priority Data

Aug. 24, 2016 (KR) .................. 10-2016-0107759

(51) Int. Cl.
*H01L 21/00* (2006.01)
*H01L 25/00* (2006.01)
(Continued)

(52) U.S. Cl.
CPC .............. *H01L 24/81* (2013.01); *H01L 21/18* (2013.01); *H01L 21/52* (2013.01); *H01L 21/677* (2013.01);
(Continued)

(58) Field of Classification Search
CPC ......... H01L 21/00; H01L 21/10; H01L 21/18; H01L 21/50; H01L 21/52; H01L 21/60;
(Continued)

(56) References Cited

U.S. PATENT DOCUMENTS

| 2010/0123268 A1* | 5/2010 | Menard | H01L 21/6835 264/293 |
| 2013/0273292 A1* | 10/2013 | Kim | B32B 37/18 428/40.1 |
| 2013/0285086 A1* | 10/2013 | Hu | H01L 24/95 257/98 |

FOREIGN PATENT DOCUMENTS

| JP | 4891895 B2 | 3/2012 |
| KR | 10-2009-0132931 A | 12/2009 |

(Continued)

OTHER PUBLICATIONS

International Search Report for PCT/KR2017/009082 dated Nov. 24, 2017 from Korean Intellectual Property Office.

*Primary Examiner* — Jacob T Minskey
*Assistant Examiner* — Matthew Hoover
(74) *Attorney, Agent, or Firm* — Revolution IP, PLLC

(57) ABSTRACT

A method for transferring a micro device, includes: a compression step in which a carrier film having a micro-device attached to an adhesive layer thereof is brought into contact
(Continued)

with a substrate comprising a solder deposited on metal electrodes formed on the substrate and is compressed on the substrate; a first adhesive strength generation step in which the solder disposed between the micro-device and the metal electrodes is compressed in the compression step to generate first adhesive strength between the micro-device and the solder; a second adhesive generation step in which the micro-device is bonded to the adhesive layer through press-fitting in the compression step to generate second adhesive strength between the micro-device and the adhesive layer; and a release step in which the carrier film is separated from the substrate, with the micro-device adhered to the solder.

8 Claims, 12 Drawing Sheets

(51) Int. Cl.
*H01L 33/00* (2010.01)
*H01L 23/00* (2006.01)
*H01L 25/075* (2006.01)
*H01L 33/62* (2010.01)
*H01L 21/677* (2006.01)
*H01L 21/52* (2006.01)
*H01L 21/18* (2006.01)
*H01L 21/768* (2006.01)

(52) U.S. Cl.
CPC ............ *H01L 21/768* (2013.01); *H01L 24/13* (2013.01); *H01L 24/16* (2013.01); *H01L 24/32* (2013.01); *H01L 24/83* (2013.01); *H01L 25/0753* (2013.01); *H01L 33/62* (2013.01); *H01L 2224/13111* (2013.01); *H01L 2224/13113* (2013.01); *H01L 2224/13139* (2013.01); *H01L 2224/16227* (2013.01); *H01L 2224/32059* (2013.01); *H01L 2224/81005* (2013.01); *H01L 2224/81192* (2013.01); *H01L 2224/81201* (2013.01); *H01L 2224/81801* (2013.01); *H01L 2224/83052* (2013.01); *H01L 2224/83201* (2013.01); *H01L 2224/83898* (2013.01); *H01L 2924/014* (2013.01); *H01L 2924/12041* (2013.01); *H01L 2933/0066* (2013.01)

(58) Field of Classification Search
CPC ....... H01L 21/67; H01L 21/677; H01L 21/70; H01L 21/76; H01L 21/768; H01L 24/00; H01L 24/10; H01L 24/13; H01L 24/16; H01L 24/30; H01L 24/32; H01L 24/80; H01L 24/81; H01L 24/83; H01L 25/00; H01L 25/07; H01L 25/075; H01L 25/0753; H01L 33/00; H01L 33/60; H01L 33/62
See application file for complete search history.

(56) References Cited

FOREIGN PATENT DOCUMENTS

| KR | 10-2011-0118616 A | 10/2011 |
| KR | 10-2013-0116648 A | 10/2013 |

* cited by examiner (a)

(b)

(a)

(b)

MICRO DEVICE TRANSFERRING METHOD, AND MICRO DEVICE SUBSTRATE MANUFACTURED BY MICRO DEVICE TRANSFERRING METHOD

TECHNICAL FIELD

The present invention relates to a micro-device transfer method and a micro-device substrate manufactured by the same and, more particularly, to a micro-device transfer method, which allows micro-devices to be transferred to a substrate without an additional process for enhancing adhesive strength, and a micro-device substrate manufactured by the same.

BACKGROUND ART

In general, a display using micro-light emitting diodes (micro-LEDs) is spotlighted as an advanced next generation display capable of replacing existing displays in the art. For manufacture of such a micro-LED display, a technique for transferring each LED to a modularized circuit board is needed.

In a typical method for transferring micro-LEDs to solders on a circuit board, the micro-LEDs are transferred one by one by a vacuum chuck. However, this method requires a very long time in manufacture of a display having a very large number of pixels, such as HD, UHD, SUHD, and the like. In addition, as the size of the devices decreases, this method has a problem of difficulty in handling devices such as micro-LEDs using the vacuum chuck used in an existing process.

Therefore, although there is a need for a technique for transferring a large number of micro-LEDs at the same time, such a technique has not been developed in the art and there is difficulty in the manufacturing process.

In order to solve such a problem, a roll transfer process can be used. However, this process has a problem in that roll transfer of micro-devices is very difficult to achieve due to very low adhesive strength of solder pastes when the micro-devices are transferred to a substrate using typical solder pastes.

DISCLOSURE

Technical Problem

It is an aspect of the present invention to provide a micro-device transfer method, which allows transfer of micro-devices to a substrate without an additional process for enhancing adhesive strength by regulating adhesive strength through control of a press-fitting depth of the micro-devices on a carrier film, and a micro-device substrate manufactured by the micro-device transfer method.

Technical Solution

In accordance with one aspect of the present invention, a micro-device transfer method includes: a compression step in which a carrier film having a micro-device attached to an adhesive layer thereof is brought into contact with a substrate including a solder deposited on metal electrodes formed thereon and is compressed on the substrate; a first adhesive strength generation step in which the solder disposed between the micro-device and the metal electrodes is compressed in the compression step to generate first adhesive strength between the micro-device and the solder; a second adhesive generation step in which the micro-device is bonded to the adhesive layer through press-fitting in the compression step to generate second adhesive strength between the micro-device and the adhesive layer; and a release step in which the carrier film is separated from the substrate, with the micro-device adhered to the solder, wherein the second adhesive strength is proportional to a press-fitting depth of the micro-device press-fitted into the adhesive layer and the press-fitting depth of the micro-device in the adhesive layer is determined within a range allowing the second adhesive strength to be less than the first adhesive strength.

The adhesive layer may have a smaller thickness than a critical press-fitting depth of the micro-device at which the second adhesive strength proportional to the press-fitting depth of the micro-device press-fitted into the adhesive layer becomes larger than the first adhesive strength.

At least one of compressive force applied to the carrier film on the substrate in the compression step, a viscoelastic coefficient of the adhesive layer and yield strength of the adhesive layer may be regulated such that the second adhesive strength proportional to the press-fitting depth of the micro-device press-fitted into the adhesive layer becomes less than the first adhesive strength.

The adhesive layer may have a greater thickness than a critical press-fitting depth of the micro-device at which the second adhesive strength proportional to the press-fitting depth of the micro-device press-fitted into the adhesive layer becomes larger than the first adhesive strength.

In the release step, release force for separating the carrier film from the substrate may be sequentially applied from one side to the other side with reference to the micro-device such that the carrier film can be sequentially separated from the micro-device from one side of a region in which the micro-device is bonded to the adhesive layer to the other side thereof.

The carrier film may be disposed to surround a cylindrical roller and the release force for separating the carrier film from the substrate may be sequentially applied to the micro-device by rotation of the roller about a rotational axis of the roller.

The carrier film may be formed in a platen shape and the release force for separating the carrier film from the substrate may be sequentially applied to the micro-device by applying the release force to one side of the carrier film.

In accordance with another aspect of the present invention, there is provided a micro-device substrate manufactured by the micro-device transfer method as set forth above.

Advantageous Effects

A micro-device transfer method according to the present invention and a micro-device substrate manufactured by the same have the following effects.

First, a process of continuously transferring a large number of micro-devices to a target substrate through combination of a roller and a platen can be advantageously achieved.

Second, the micro-devices can be advantageously transferred to the substrate using adhesive strength generated by mechanical deformation between the micro-devices, a carrier film and solders, instead of using adhesive strength chemically regulated by a typical method in the art.

BEST MODE

Figure 1:
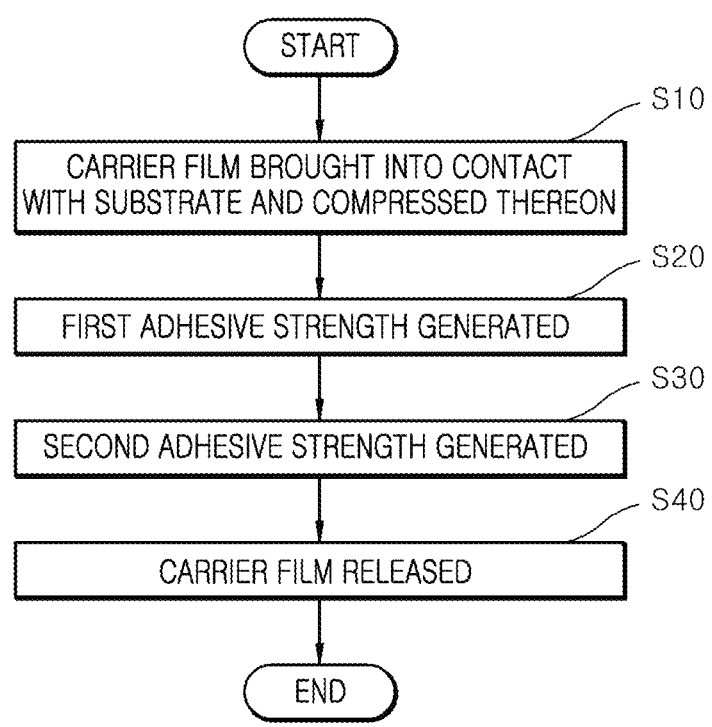
FIG. 1 is a flow diagram of a micro-device transfer method according to one embodiment of the present invention.

Hereinafter, embodiments of the present invention will be described with reference to the accompanying drawings. In description of the following embodiments. Like components will be denoted by like reference numerals throughout the specification and portions irrelevant to the description will be omitted for clarity.

Herein, when a layer, a film, a region, a sheet or the like is referred to as being disposed "on" another layer, film, region, sheet or the like, it may be directly on the other layer, film, region, sheet or the like, or intervening elements or layers may be present. In addition, when an element is referred to as being disposed "on" another element, this means that the element is disposed on or under the other element and does not means that the element is necessarily disposed on the other element with reference to the direction of gravity.

Herein, the terms "comprises," "comprising," "including," and "having," are inclusive and therefore specify the presence of stated features, elements, and/or components, but do not preclude the presence or addition of one or more other features, elements, and/or components, unless specifically stated otherwise. It should be understood that the drawings are not to precise scale and may be exaggerated in thickness of lines or size of components for descriptive convenience and clarity only and the present invention is not limited thereto.

Referring to FIG. 1 to FIG. 12, the following description will be given of a micro-device transfer method according to one embodiment of the present invention and a micro-device substrate manufactured by the same.

As shown in FIG. 1 to FIG. 12, the micro-device transfer method according to the embodiment of the present invention includes a compression step S10, a first adhesive strength generation step S20, a second adhesive generation step S30, and a release step S40.

Figure 2:
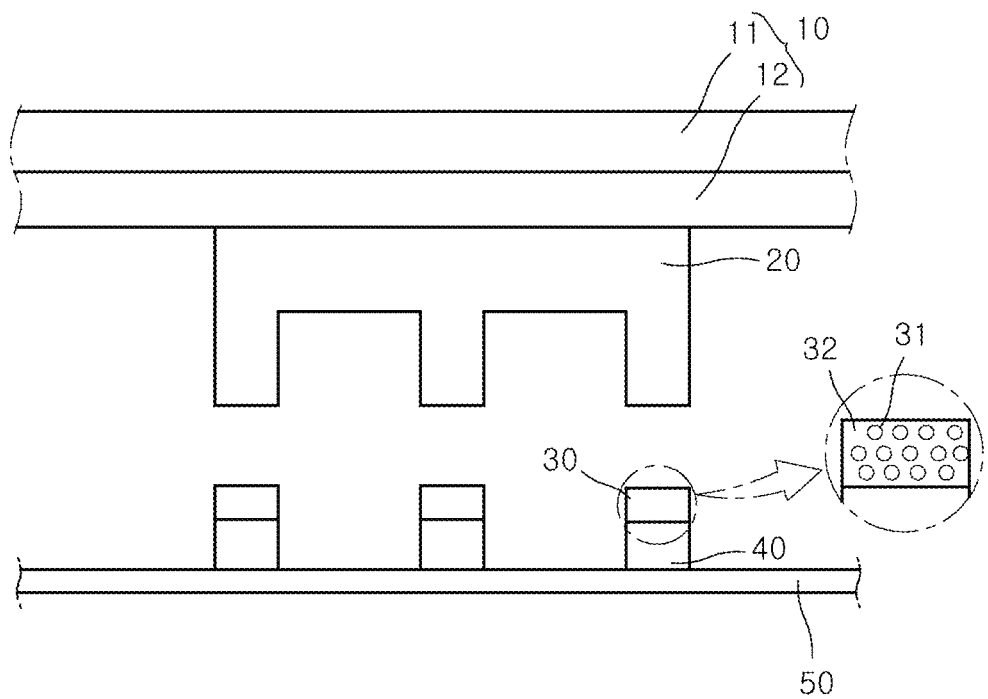
FIG. 2 shows a micro-device and a carrier film before a compression step of the micro-device transfer method of FIG. 1.
Figure 3:
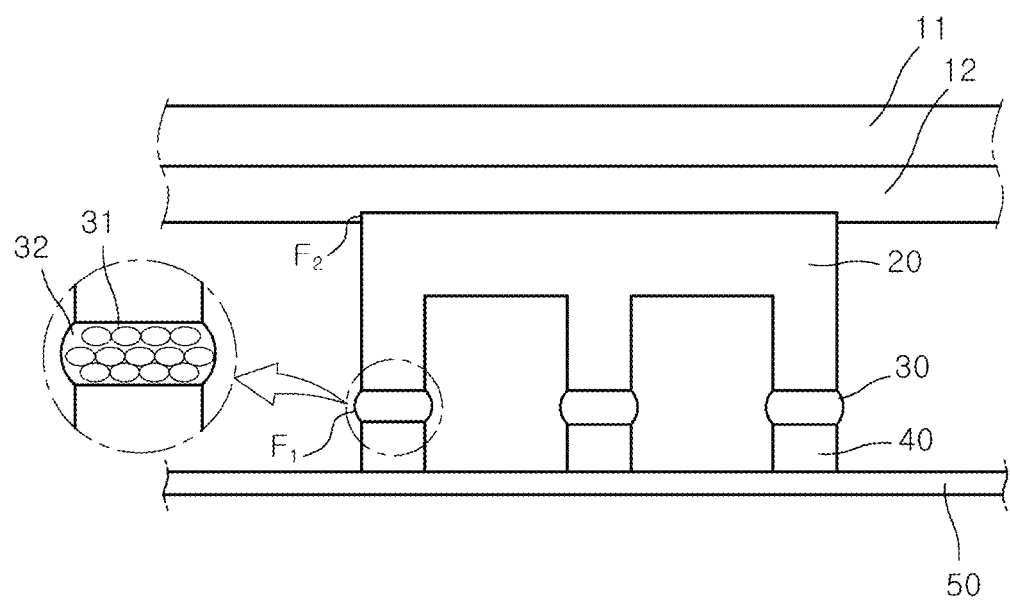
FIG. 3 shows the micro-device and the carrier film after the compression step of the micro-device transfer method of FIG. 1.

First, as shown in FIG. 2, a carrier film 10 including a micro-device 20 attached thereto and a substrate 50 including a solder 30 deposited on metal electrodes formed on the substrate 50 are prepared and aligned such that the micro-device 20 can be brought into contact with the solder 30.

As the carrier film 10 is moved toward the substrate 50, the micro-device 20 is brought into contact with the metal electrodes 40. The solder 30 is deposited on the metal electrodes 40 to enhance adhesive strength between the metal electrodes 40 and the micro-device 20. The metal electrodes 40 are disposed on the substrate 50 to supply electric power to the micro-device 20 and may be formed of gold (Au).

The carrier film 10 includes an adhesive layer 12 to which the micro-device 20 is attached and a base film 11 supporting the adhesive layer 12 such that the micro-device 20 can be press-fitted into the adhesive layer 12 by pressure applied to the carrier film 10 through the micro-device 20 in the compression step S10.

In the compression step S10, the carrier film 10 having the micro-device 20 attached to the adhesive layer 12 is brought into contact with the substrate 50 having the solder 30 deposited on the metal electrodes 40 and is compressed thereon.

The adhesive layer 12 may be formed of a previously cured UV curable adhesive material, such as SOG, PMMA, Su-8, and the like.

The solder 30 is provided in the form of pastes including solder balls 31 and a flux 32 surrounding the solder balls 31 while fluidly moving, in which the solder balls 31 may be composed of silver (Ag), tin (Sn), or bismuth (Bi) alloys.

In the first adhesive strength generation step S20, the solder 30 disposed between the micro-device 20 and the metal electrodes 40 is compressed in the compression step S10 to generate first adhesive strength $F_1$ between the micro-device 20 and the solder 30.

In the first adhesive strength generation step S20, the solder balls 31 are deformed from a spherical shape to an elliptical shape by pressure applied thereto in the compression step S10.

In the second adhesive generation step S30, the micro-device 20 is press-fitted into and bonded to the adhesive layer 12 in the compression step S10 to generate second adhesive strength $F_2$ between the micro-device 20 and the adhesive layer 12.

Here, the second adhesive strength F2 is proportional to a press-fitting depth of the micro-device 20 in the adhesive layer 12.

Specifically, a contact area between the adhesive layer 12 and an edge of the micro-device 20 increases with increasing press-fitting depth of the micro-device 20 in the adhesive layer 12, thereby causing increase in friction between the adhesive layer 12 and the micro-device 20.

Next, a relationship between the press-fitting depth and adhesive strength of the micro-device 20 with respect to the adhesive layer 12 will be described with reference to FIG. 4.

In FIG. 4(a), the press-fitting depth of the micro-device 20 in the adhesive layer 12 is denoted by $d_a$, and in FIG. 4(b), the press-fitting depth of the micro-device 20 in the adhesive layer 12 is denoted by $d_b$, which is greater than $d_a$.

Adhesive strength $F_{2b}$ between the micro-device 20 having a press-fitting depth $d_b$ and the adhesive layer 12 is larger than adhesive strength $F_{2a}$ between the micro-device 20 having a press-fitting depth $d_a$ and the adhesive layer 12, since the contact area between the adhesive layer 12 having a press-fitting depth $d_b$ and the edge of the micro-device 20 is larger than the contact area between the adhesive layer 12 having a press-fitting depth $d_a$ and the edge of the micro-device 20 to generate larger friction.

Accordingly, the second adhesive strength $F_2$ is proportional to the press-fitting depth of the micro-device 20.

Figure 4:
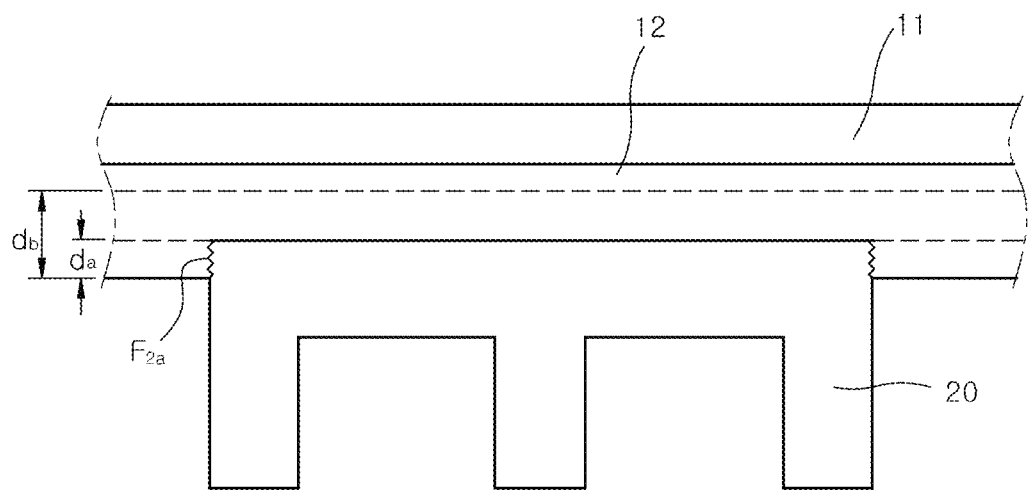
FIG. 4 is a view depicting a relationship between press-fitting depth and adhesive strength of the micro-device with respect to the carrier film in the micro-device transfer method of FIG. 1.
Figure 4:
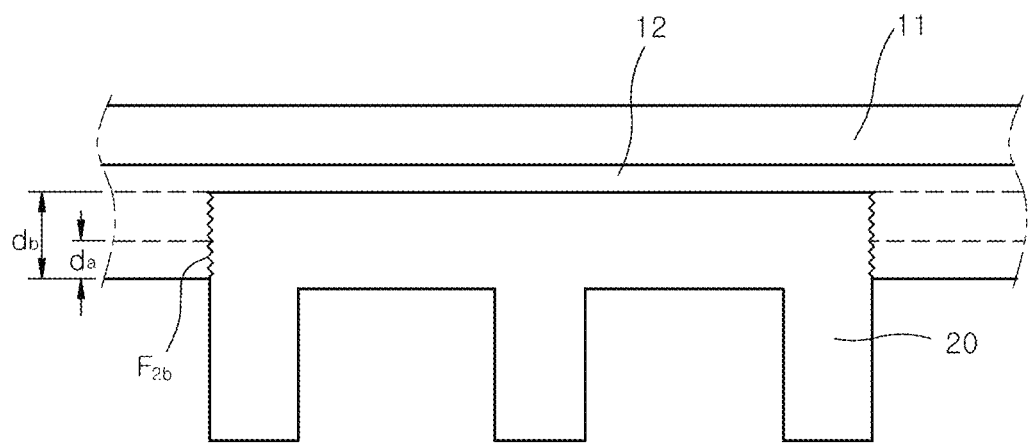

Here, the adhesive strength $F_{2b}$ between the micro-device 20 having a press-fitting depth $d_b$ and the adhesive layer 12 and the adhesive strength $F_{2a}$ between the micro-device 20 having a press-fitting depth $d_a$ and the adhesive layer 12 are indicated by wave patterns in FIG. 4.

In the release step S40, with the micro-device 20 bonded to the solder 30, the carrier film 10 is separated from the substrate 50.

Here, in order to allow the micro-device 20 to be separated from the adhesive layer 12 with the micro-device 20 bonded to the solder 30, it is desirable that the second adhesive strength $F_2$ be less than the first adhesive strength $F_1$.

Figure 5:
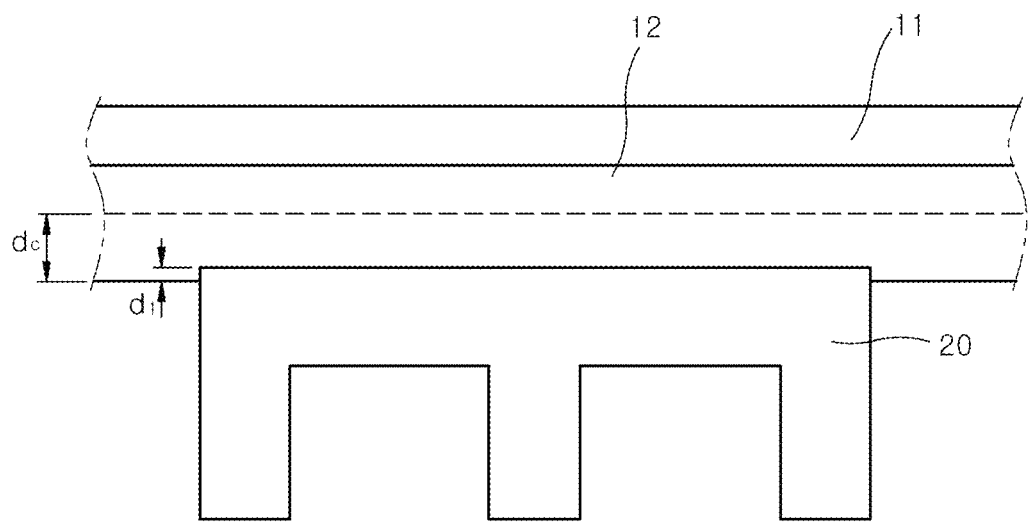
FIG. 5 is a view illustrating a critical press-fitting depth of the micro-device in the micro-device transfer method of FIG. 1.
Figure 5:
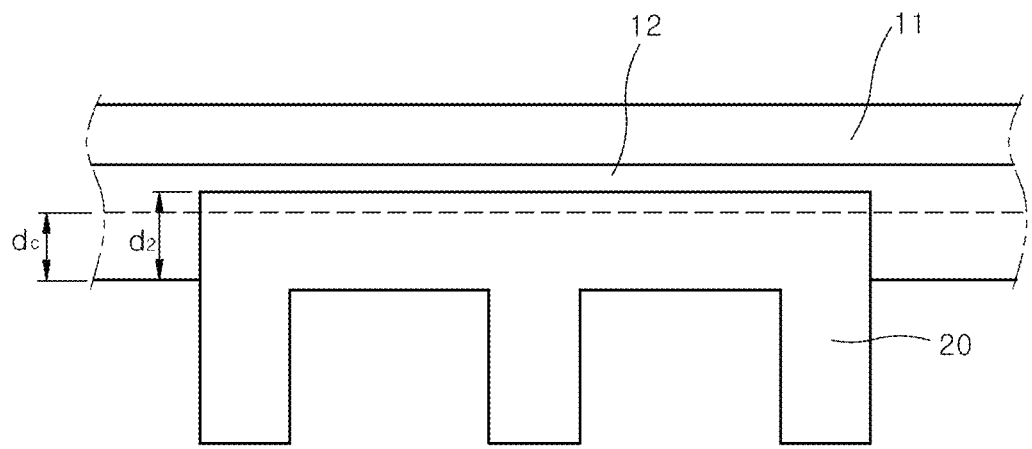

Referring to FIG. 5, a critical press-fitting depth enabling easy separation of the micro-device 20 from the adhesive layer 12 will now be described.

Referring to FIG. 5(a), when the press-fitting depth of the micro-device 20 in the adhesive layer 12 is $d_1$, which is less than the critical press-fitting depth $d_c$, the second adhesive strength $F_2$ between the adhesive layer 12 and the micro-device 20 is less than the first adhesive strength $F_1$ between the solder 30 and the micro-device 20.

In this case, when the carrier film 10 is separated from the substrate 50, the micro-device 20 is separated from the carrier film 10, with the micro-device 20 bonded to the solder 30.

Referring to FIG. 5(b), when the press-fitting depth of the micro-device 20 in the adhesive layer 12 is $d_2$, which is greater than the critical press-fitting depth $d_c$, the second adhesive strength $F_2$ between the adhesive layer 12 and the micro-device 20 is greater than the first adhesive strength $F_1$ between the solder 30 and the micro-device 20.

In this case, when the carrier film 10 is separated from the substrate 50, the micro-device 20 is moved together with the carrier film 10 in a state in which the micro-device 20 attached to the carrier film 10.

That is, the critical press-fitting depth means a boundary press-fitting depth at which the second adhesive strength $F_2$ becomes larger than the first adhesive strength $F_1$ and a relative magnitude of the second adhesive strength $F_2$ with respect to the first adhesive strength $F_1$ may be regulated using the critical press-fitting depth.

Figure 6:
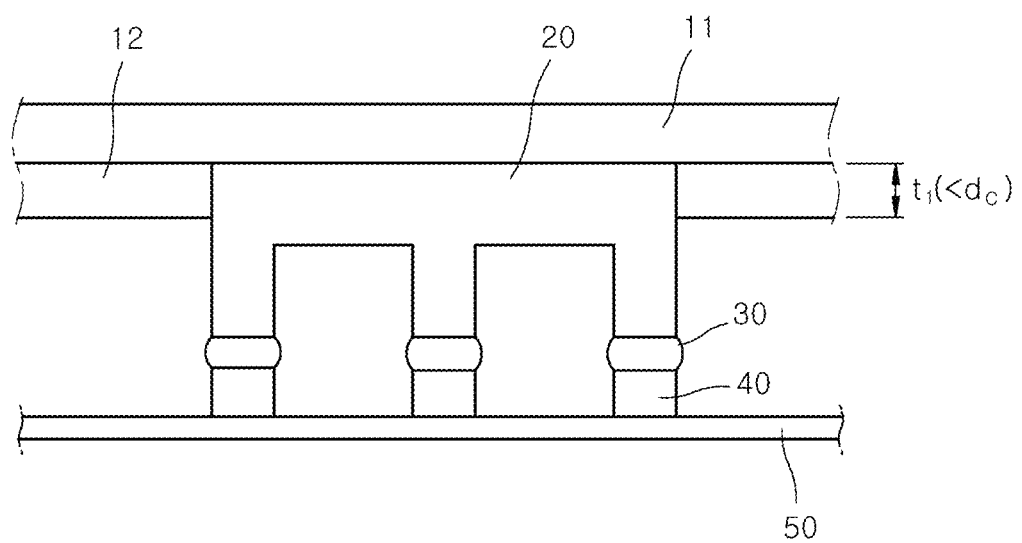
FIG. 6 is a view illustrating the carrier film in the micro-device transfer method of FIG. 1.

As shown in FIG. 6, the adhesive layer 12 is formed to a thickness $t_1$ less than the critical press-fitting depth in order to prevent the micro-device 20 from reaching the critical press-fitting depth $d_c$.

As the adhesive layer 12 is formed to have a smaller thickness than the critical press-fitting depth $d_c$, the second adhesive strength $F_2$ is always less than the first adhesive strength $F_1$ even when the micro-device 20 is press-fitted into the carrier film 10 by the thickness of the adhesive layer 12.

Accordingly, it is possible to generate the second adhesive strength $F_2$ to be less than the first adhesive strength $F_1$ without regulating properties of the adhesive layer 12 for regulation of the press-fitting depth of the micro-device 20, such as viscoelastic coefficient of the adhesive layer 12, yield strength of the adhesive layer 12, and the like, compressive force with respect to the carrier film 10 and the substrate 50, and the like.

Figure 7:
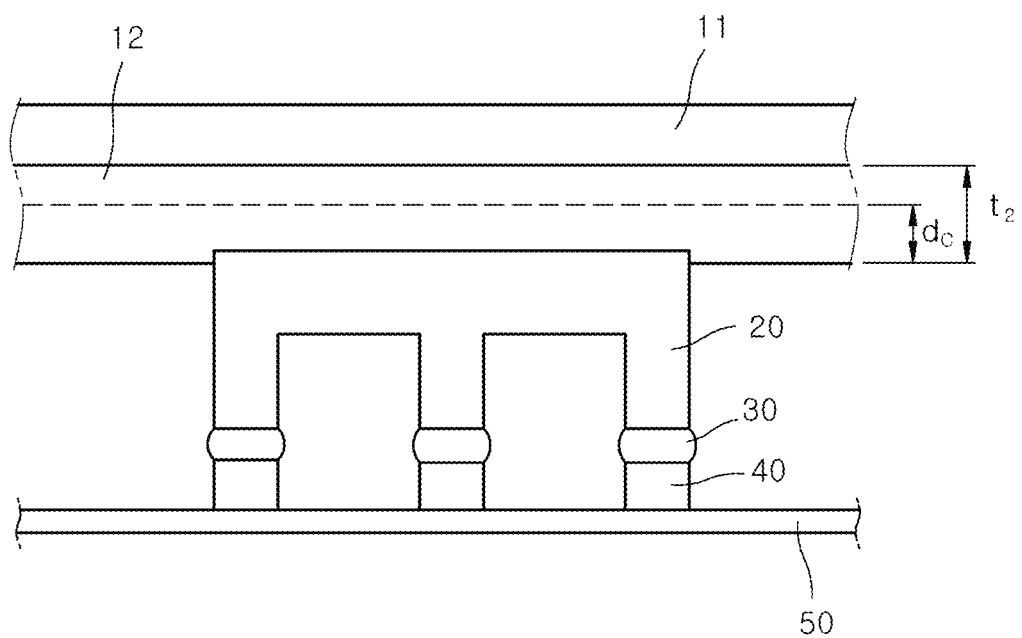
FIG. 7 is a view of a modification of the carrier film of FIG. 6.
Figure 8:
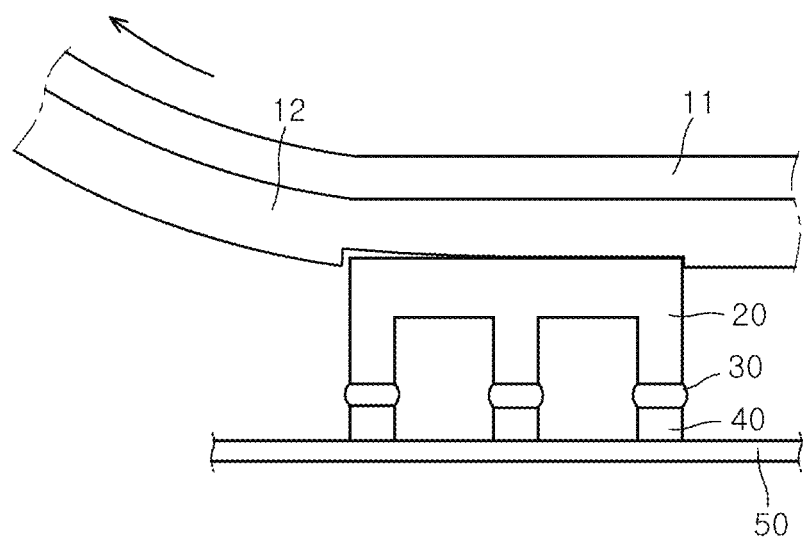
FIG. 8 is a view illustrating a principle of a release step of the micro-device transfer method of FIG. 1.

On the other hand, as shown in FIG. 7, the thickness $t_2$ of the adhesive layer 12 may be greater than the critical press-fitting depth $d_c$.

As the adhesive layer 12 is formed to a greater thickness than the critical press-fitting depth $d_c$, the press-fitting depth of the micro-device 20 can become greater than the critical press-fitting depth and the second adhesive strength $F_2$ can become larger than the first adhesive strength $F_1$ depending upon the press-fitting depth of the micro-device 20, thereby causing a problem in the course of separating the micro-device 20 from the carrier film 10.

In order to prevent this problem, the second adhesive strength F2 becomes less than the first adhesive strength F1 by regulating the compressive force applied in the compression step S10.

In addition, in order to generate the second adhesive strength $F_2$ to be less than the first adhesive strength $F_1$, the viscoelastic coefficient of the adhesive layer 12 may be regulated.

Specifically, in order to guarantee that the second adhesive strength $F_2$ generated between the adhesive layer 12 and the micro-device 20 is less than the first adhesive strength $F_1$ generated between the solder 30 and the micro-device 20, the adhesive layer 12 may be formed of a material having a high viscoelastic coefficient.

Further, in order to generate the second adhesive strength $F_2$ to be less than the first adhesive strength $F_1$, yield strength of the adhesive layer 12 may be regulated.

When compressive force applied in the compression step S10 increases above an elastic limit of the adhesive layer 12, elastic deformation can occur in the course of press-fitting the micro-device 20 into the adhesive layer 12. Here, if the adhesive layer 12 has relatively low yield strength, the press-fitting depth of the micro-device 20 is relatively increased by the compressive force exceeding the elastic limit of the adhesive layer 12, thereby causing generation of the second adhesive strength $F_2$ larger than first adhesive strength $F_1$.

Thus, the yield strength of the adhesive layer 12 may be regulated to become large such that the micro-device 20 can be press-fitted to a relatively small depth into the adhesive layer 12 by the compressive force exceeding the elastic limit of the adhesive layer 12, whereby the second adhesive strength F2 can become less than the first adhesive strength F1.

As described above, in order to generate the second adhesive strength $F_2$ to be less than the first adhesive strength $F_1$, the compressive force applied in the compression step S10, the viscoelastic coefficient of the adhesive layer 12, and the yield strength of the adhesive layer 12 may be regulated individually or in combination.

In the release step S40, the micro-device 20 may be sequentially separated from the adhesive layer 12 from one side of a bonded region therebetween to the other side thereof.

When the entirety of the micro-device 20 is separated from the carrier film 10 at the same time under a condition that the difference between the first adhesive strength $F_1$ and the second adhesive strength $F_2$ is not large, there is a possibility that some micro-devices 20 remain on the carrier film 10 in the release step.

To prevent this problem, release force for separating the carrier film 10 from the substrate is sequentially applied from one side of the carrier film 10 to the other side thereof with reference to the micro-device 20.

As the release force is sequentially applied to the micro-device 20, the second adhesive strength $F_2$ is dispersed in the release step S40, whereby the second adhesive strength corresponding to the first adhesive strength is reduced, thereby allowing the micro-device 20 to be more easily separated from the adhesive layer 12.

Figure 9:
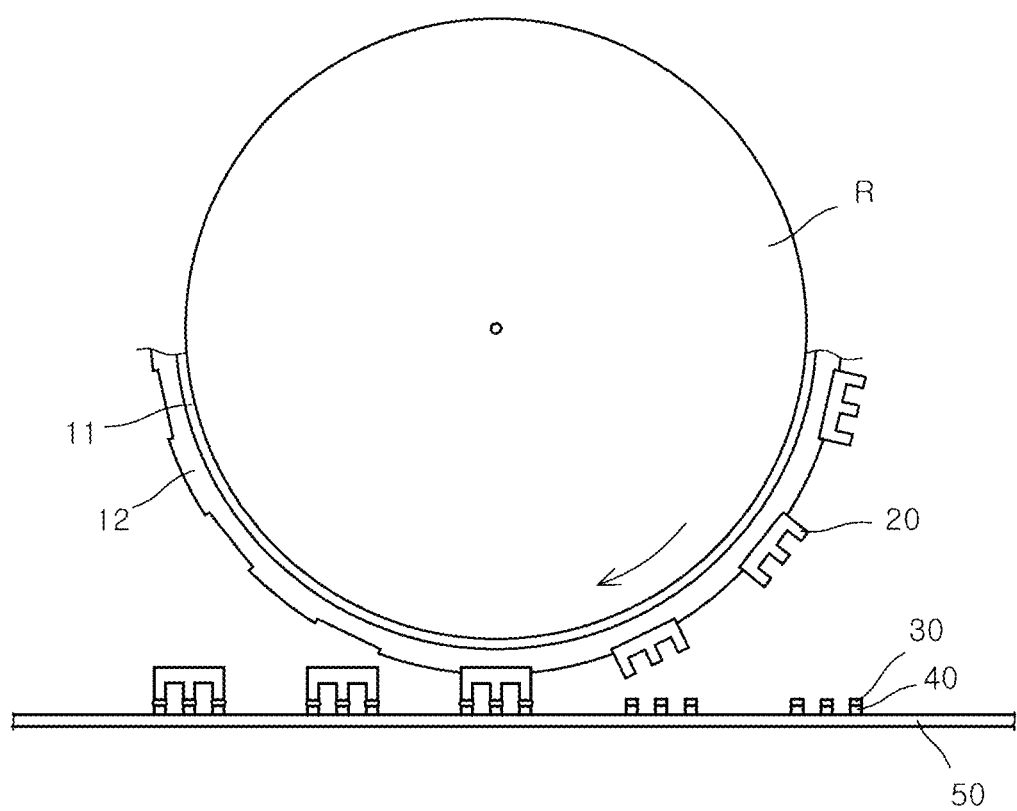
FIG. 9 is a view illustrating the release step of the micro-device transfer method of FIG. 1.

As shown in FIG. 9, release of the carrier film 10 may be performed through coupling with a roller R in the release step S40.

Specifically, the carrier film 10 is disposed to surround a cylindrical roller R and the carrier film 10 is sequentially compressed on the substrate 50 by rotation of the roller R about a rotational axis of the roller R to generate the first adhesive strength $F_1$ and the second adhesive strength $F_2$.

Thereafter, the release force for separating the micro-device 20 from the adhesive layer 12 is sequentially applied to the micro-device 20 by rotation of the roller R, thereby enabling separation of the micro-device 20 from the adhesive layer 12.

Figure 10:
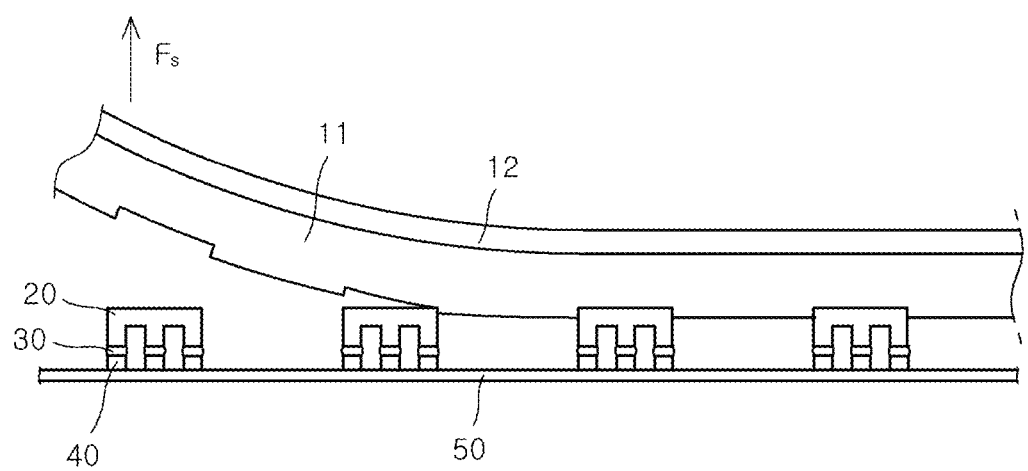
FIG. 10 is a view illustrating a modification of the release step of FIG. 9.

It should be understood that the present invention is not limited thereto and the carrier film 10 may have a platen shape as shown in FIG. 10.

Thus, the carrier film 10 having a platen shape is compressed on the substrate 50 to generate the first adhesive strength $F_1$ and the second adhesive strength $F_2$, and the release force $F_s$ for separating the micro-device 20 from the adhesive layer 12 is applied to one side of the carrier film 10.

Here, the release force $F_s$ is sequentially applied to the micro-device 20.

As a result, the micro-device 20 can be advantageously transferred to the substrate 50 using adhesive strength generated by mechanical deformation between the micro-device 20, the carrier film 10, and the solder 30, instead of using adhesive strength chemically regulated by a typical method in the related art.

Thus, the micro-device 20 can be more conveniently and stably transferred to the substrate 50 using the difference between the first adhesive strength and the second adhesive strength generated in the compression step S10 only through the process of separating the micro-device 20 from the adhesive layer 12.

Figure 11:
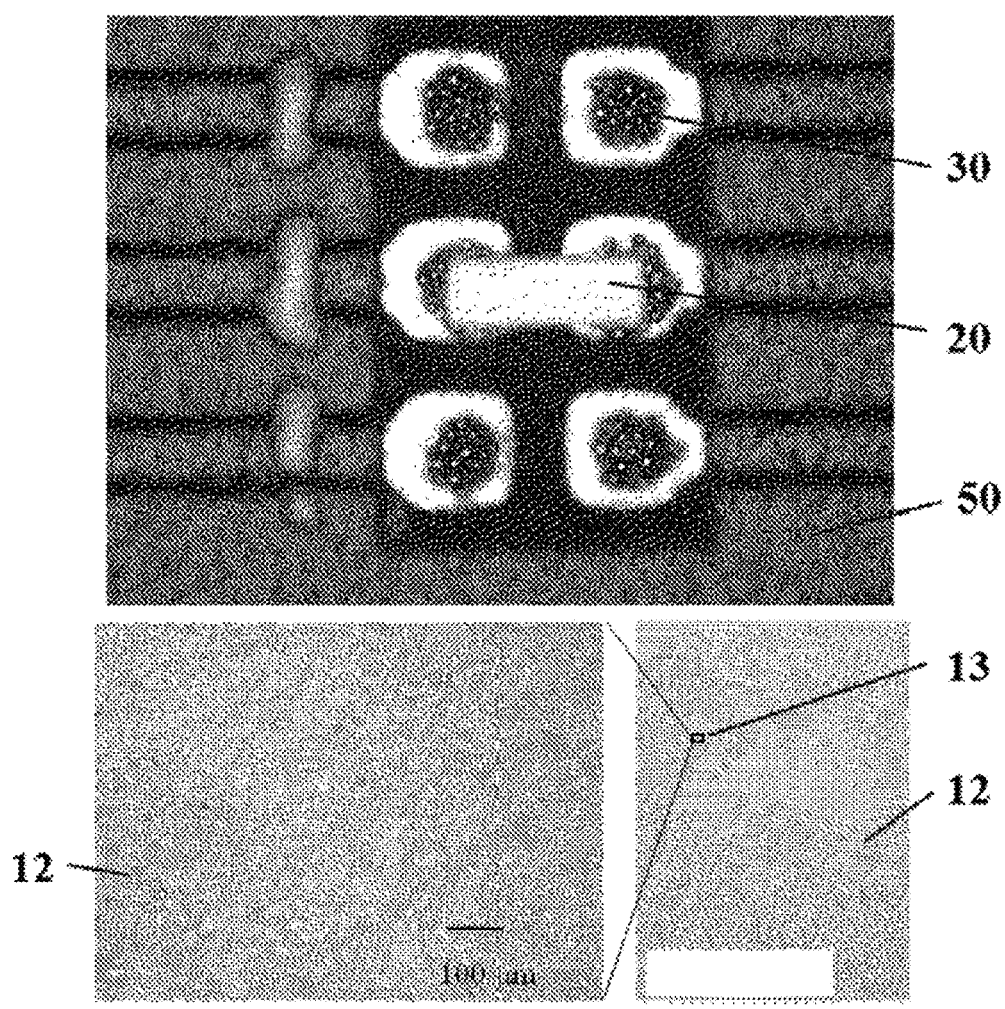
FIG. 11 is a picture showing micro-devices having a smaller press-fitting depth than a critical press-fitting depth and transferred to a substrate.

FIG. 11 shows a state in which the micro-device 20 having a smaller press-fitting depth $d_1$ than the critical press-fitting depth $d_c$ is transferred to the substrate 50.

In the structure wherein the micro-device 20 has a smaller press-fitting depth $d_1$ than the critical press-fitting depth $d_c$, since the second adhesive strength $F_2$ between the adhesive layer 12 and the micro-device 20 is less than the first adhesive strength F1 between the solder 30 and the micro-device 20, the micro-device 20 is transferred to the substrate 50 to be attached to the solder 30.

FIG. 11 shows a press-fitting trace of the micro-device 20 separated from the adhesive layer 12 at a press-fitting location 13 on the adhesive layer 12 into which the micro-device 20 is press-fitted, and it can be seen that, since the micro-device 20 has a smaller press-fitting depth $d_1$ than the critical press-fitting depth $d_c$, there is substantially no press-fitting trace.

Figure 12:
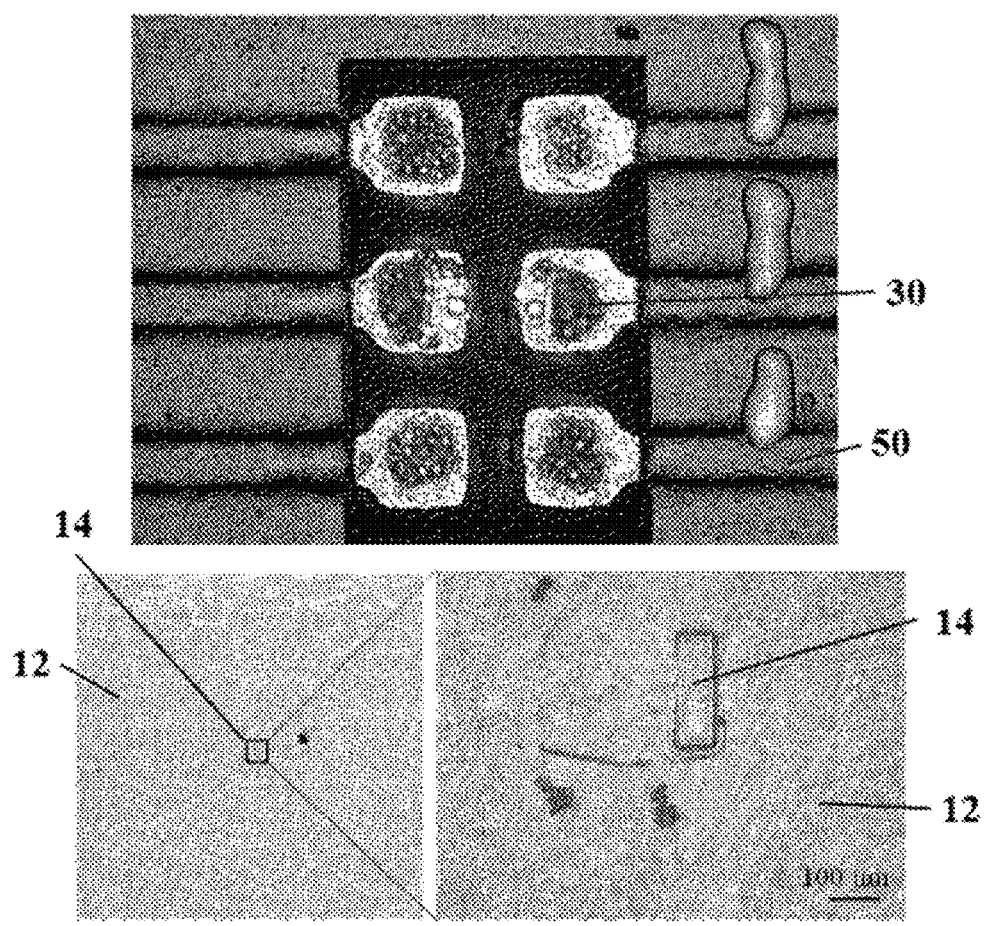
FIG. 12 is a picture showing micro-devices having a smaller press-fitting depth than a critical press-fitting depth and not transferred to a substrate.

FIG. 12 shows a state in which the micro-device 20 having a greater press-fitting depth $d_2$ than the critical press-fitting depth $d_c$ is transferred to the substrate 50.

In the structure wherein the micro-device 20 has a greater press-fitting depth $d_2$ than the critical press-fitting depth $d_c$, since the second adhesive strength $F_2$ between the adhesive layer 12 and the micro-device 20 is larger than the first adhesive strength F1 between the solder 30 and the micro-device 20, the micro-device 20 remains on the adhesive layer 12, instead of being transferred to the substrate 50.

FIG. 12 shows a press-fitting trace of the micro-device 20 separated from the adhesive layer 12 at a press-fitting location 14 on the adhesive layer 12 into which the micro-device 20 is press-fitted, and it can be seen that, since the micro-device 20 has a greater press-fitting depth $d_2$ than the critical press-fitting depth as described above, a clear press-fitting trace of the micro-device remains on the adhesive layer.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the present invention.

INDUSTRIAL APPLICABILITY

The present invention has industrial applicability in the technical field of transferring micro-devices to a substrate without an additional process for enhancing adhesive strength.

The invention claimed is:

1. A micro-device transfer method comprising:
a compression step in which a carrier film having a micro-device attached to an adhesive layer thereof is brought into contact with a substrate comprising a solder deposited on metal electrodes formed on the substrate and is compressed on the substrate;
a first adhesive strength generation step in which the solder disposed between the micro-device and the metal electrodes is compressed in the compression step to generate first adhesive strength between the micro-device and the solder;
a second adhesive generation step in which the micro-device is bonded to the adhesive layer through press-fitting in the compression step to generate second adhesive strength between the micro-device and the adhesive layer; and
a release step in which the carrier film is separated from the substrate, with the micro-device adhered to the solder,
wherein the second adhesive strength is proportional to a press-fitting depth of the micro-device press-fitted into the adhesive layer and the press-fitting depth of the micro-device in the adhesive layer is determined within a range allowing the second adhesive strength to be less than the first adhesive strength.

2. The micro-device transfer method according to claim 1, wherein the adhesive layer has a smaller thickness than a critical press-fitting depth of the micro-device at which the second adhesive strength proportional to the press-fitting depth of the micro-device press-fitted into the adhesive layer becomes larger than the first adhesive strength.

3. The micro-device transfer method according to claim 1, wherein at least one of compressive force applied to the carrier film on the substrate in the compression step, a viscoelastic coefficient of the adhesive layer and yield strength of the adhesive layer is regulated such that the second adhesive strength proportional to the press-fitting depth of the micro-device press-fitted into the adhesive layer becomes less than the first adhesive strength.

4. The micro-device transfer method according to claim 3, wherein the adhesive layer has a greater thickness than a critical press-fitting depth of the micro-device at which the second adhesive strength proportional to the press-fitting depth of the micro-device press-fitted into the adhesive layer becomes larger than the first adhesive strength.

5. The micro-device transfer method according to claim 1, wherein, in the release step, release force for separating the carrier film from the substrate is sequentially applied from one side to the other side with reference to the micro-device such that the carrier film is sequentially separated from the micro-device from one side of a region in which the micro-device is bonded to the adhesive layer to the other side thereof.

6. The micro-device transfer method according to claim 5, wherein the carrier film is disposed to surround a cylindrical roller and the release force for separating the carrier film from the substrate is sequentially applied to the micro-device by rotation of the roller about a rotational axis of the roller.

7. The micro-device transfer method according to claim 5, wherein the carrier film is formed in a platen shape and the release force for separating the carrier film from the substrate is sequentially applied to the micro-device by applying the release force to one side of the carrier film.

8. A micro-device substrate manufactured by the micro-device transfer method according to claim 1.

\* \* \* \* \*